US006536096B2

(12) United States Patent
Sato et al.

(10) Patent No.: US 6,536,096 B2
(45) Date of Patent: *Mar. 25, 2003

(54) METHOD OF PREPARING BISMUTH OXIDE SUPERCONDUCTING WIRE

(75) Inventors: Kenichi Sato, Osaka (JP); Nobuhiro Shibuta, Osaka (JP); Hidehito Mukai, Osaka (JP); Takeshi Hikata, Osaka (JP); Munetsugu Ueyama, Osaka (JP); Takeshi Kato, Osaka (JP)

(73) Assignee: Sumitomo Electric Industries, Ltd (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/167,581

(22) Filed: Dec. 15, 1993

(65) Prior Publication Data

US 2002/0050053 A1 May 2, 2002

Related U.S. Application Data

(63) Continuation of application No. 07/822,244, filed on Jan. 17, 1992, now abandoned.

(30) Foreign Application Priority Data

Jan. 19, 1991 (JP) ................................. 3-19405

(51) Int. Cl.⁷ ............................................... H01L 39/24
(52) U.S. Cl. ......................... 29/599; 505/430; 505/433
(58) Field of Search ............................ 29/599; 505/430, 505/433

(56) References Cited

U.S. PATENT DOCUMENTS

| | | | | |
|---|---|---|---|---|
| 5,057,489 A | * | 10/1991 | Arendt et al. | .................. 595/1 |
| 5,096,879 A | * | 3/1992 | Arendt | .................. 505/1 |
| 5,204,316 A | * | 4/1993 | Arendt et al. | ............. 29/599 X |
| 5,206,211 A | * | 4/1993 | Meyer | ......................... 505/432 |
| 5,288,699 A | * | 2/1994 | Sato et al. | ................. 29/599 X |
| 5,610,123 A | * | 3/1997 | Sato et al. | ................. 29/599 X |

FOREIGN PATENT DOCUMENTS

| | | | | |
|---|---|---|---|---|
| CA | 2031692 | * | 6/1991 | |
| EP | 0 285 319 A | | 10/1988 | |
| EP | 0 356 969 A | | 3/1990 | |
| EP | 0 379 960 | | 8/1990 | |
| EP | 0 397 943 A | | 11/1990 | |
| EP | 0 467 237 | | 1/1992 | |
| EP | 0 467 238 | | 1/1992 | |
| JP | 01122961 A | * | 5/1989 | |
| JP | 401138167 A | * | 5/1989 | ........... C04B/35/00 |
| JP | 402199055 A | * | 8/1990 | ........... C04B/35/00 |
| SU | 344546 | * | 8/1973 | |
| WO | 91/00622 | | 1/1991 | |

OTHER PUBLICATIONS

Sakka et al., "Gas Adsorption and Desorption Properties of Oxide Superconductor Powder", presented at the spring meeting of Powder Metallurgy Assoc. in Tokyo, May 31, 1981.*

Derwent Abstract 1992–026083, Derwent week 199802, "Oxide superconducting wire with increased critical current density . . .", Hikata et al.*

Derwent Abstract 1991–289616, Derwent week 200042, "Formation of a bismuth oxide superconductor . . . ", Hikata et al.*

"Critical Current Density in Superconducting Bi–Pb–Sy––Ca–Cu–O Wires and Coils", Dou et al., Superconductor Science Technology (1990).*

Sekine et al., "Metallurgical Studies and Optimization of Critical Current Density in Bi–(Pb)–Sr–Ca–Cu–O Superconductors", Japanese Journal Of Applied Physics, vol. 28, No. 7 (Jul. 1989) 1185–1188.

Yamada et al., "Critical currents and flux creep in orientated Bi–Pb–Sr–Ca–Cu–O 110 K phase made by the powder in tube method", Cryogenics, vol. 30 (1990) 581–585.

Hikata et al., "Electromagnetic Properties and Morphology of Ag–Sheathed Bi–Pb–Sr–Ca–Cu–O Superconducting Wires," Japanese Journal of Applied Physics, vol. 28, No. 7, Jul. 1989, pp. L1204–L1206.

Lo et al., "The Development of the 2223 Phase in Pb–Doped Bi–Sr–Ca–Cu–O Superconducting Compositions," British Ceramic Transactions and Journal, 89 Nov./Dec., 1990, No. 6, pp. 218–222.

(List continued on next page.)

*Primary Examiner*—S. Thomas Hughes
(74) *Attorney, Agent, or Firm*—Pennie & Edmonds LLP

(57) ABSTRACT

Powder of not more than 1 μm in mean particle diameter is prepared to contain a mixture of superconducting phases mainly composed of 2212 phases of Bi—Sr—Ca—Cu or (Bi, Pb)—Sr—Ca—Cu and non-superconducting phases which is obtained by calcining and pulverizing raw material powder at least once, this powder is heat treated at a high temperature and thereafter coated with a metal to prepare a round wire by deformation processing, thereafter a tape type or flat type wire is prepared by deformation processing, then the wire is heat treated under conditions for allowing phase transformation of the 2212 phases of main superconducting phases to 2223 phases with facilitation of grain growth, thereafter the as-formed 2223 phases are highly densified by deformation processing or pressurization, and the wire is again heat treated so that the 2223 phases are strongly bonded with each other and the non-superconducting phases are finely dispersed. Thus, a bismuth oxide superconducting wire having a high critical current density is obtained.

10 Claims, No Drawings

OTHER PUBLICATIONS

Kozlowski et al., "Bi–Based High Temperature Superconducting Tapes by Cold Rolling Method," IEEE Transactions On Magnetics, vol. 27, No. 2, Mar. 1991, pp. 890–893.

Flükiger et al., "Critical Currents in Ag Sheated Tapes of the 2223–Phase in (Bi,Pb) Sr–Ca–Cu–O (Invited)," IEEE Transactions On Magnetics, vol. 27, No. 2, Mar. 1991, pp. 1258–1263, as well as cover sheet and pp. 814–815.

P.V.P.S.S. Sastry et al., "Towards the Synthesis of the Single–Phase Bi–2223 superconductor from Stoichiometric $(Bi,PB)_2Ca_2Sr_2Cu_3Oy$ Compositions," Physica C Superconductivity, vol. 161, No. 5/6, Dec. 15, 1989, Amsterdam, NL, pp. 656–660.

Wai Lo et al., "The Development of the 2223 Phase in Pb–Doped Bi–Sr–Ca–Cu–O Superconducting Compositions, "British Ceramic Transactions and Journal, vol. 89, No. 6, Nov./Dec. 1990, Stoke–On–Trent, GB, pp. 218–222.

* cited by examiner

METHOD OF PREPARING BISMUTH OXIDE SUPERCONDUCTING WIRE

This is a continuation of application Ser. No. 07/822,244, filed Jan. 17, 1992, now abandoned.

BACKGROUND OF THE INVENTION

1. Field of the Invention

The present invention relates to a method of preparing a bismuth oxide superconducting wire, and more particularly, it relates to an improvement for increasing the critical current density of a bismuth oxide superconducting wire.

2. Description of the Background Art

In recent years, superconductive materials of ceramics, i.e., oxide superconductive materials are watched with interest as those exhibiting higher critical temperatures.

In particular, a bismuth oxide superconductive material is expected for practical use due to a high critical temperature of about 110 K. It is known that a bismuth oxide superconductor has phases having critical temperatures of 110 K, 80 K and 10 K. It is also known that non-superconducting phases partially appear when a 110 K-phase superconductor is prepared in particular.

In relation to such a bismuth oxide superconductor, it is further known that a 110 K phase has a 2223 composition of Bi—Sr—Ca—Cu or (Bi, Pb)—Sr—Ca—Cu and a 80 K phase has a 2212 composition of the same components.

On the other hand, an oxide superconducting wire is generally prepared by filling a metal pipe with oxide raw material powder, working the same into a wire through deformation processing such as extrusion, wire drawing or rolling, and thereafter heat treating the wire.

In order to work an oxide superconductor into an oxide superconducting wire and apply the same to a superconducting magnet, a wire for a device or a power cable, for example, it is important to attain a high critical current density, in addition to a high critical temperature. A current density exceeding at least 1000 A/cm$^2$ must be attained in order to put an oxide superconducting wire into practice.

When a superconductor is worked into a long oxide superconducting wire, further, such a current density must be substantially uniformly attained over the longitudinal direction of the superconducting wire. While it is effective to employ a bismuth superconductor, particularly that containing Bi partially replaced by Pb, in order to increase the critical temperature, the current density of such a bismuth superconductor generally remains at about 100 to 200 A/cm$^2$ at the most.

In practice, however, it is necessary to attain a current density of at least 10 times thereof, and such a high current density must be substantially uniformly attained over the longitudinal direction of the superconducting wire.

SUMMARY OF THE INVENTION

Accordingly, an object of the present invention is to provide a method of preparing a bismuth oxide superconducting wire, which exhibits a higher critical current density.

In order to solve the aforementioned technical problem, the inventive method comprises:

(1) A step of preparing powder of not more than 1 @m in mean particle diameter containing a mixture of superconducting phases mainly composed of 2212 phases of Bi—Sr—Ca—Cu or (Bi, Pb)—Sr—Ca—Cu and non-superconducting phases obtained by calcining and pulverizing raw material powder of oxides, carbonate etc. at least once;

(2) A step of heat treating the powder at a high temperature;

(3) a step of coating the powder with a metal;

(4) a step of preparing a round wire by deformation-processing the as-formed composite of the powder and the metal coat;

(5) a step of deformation-processing the round wire thereby preparing a tape type or flat type wire;

(6) a step of heat treating the wire under conditions for allowing phase transformation of the 2212 phases contained in the superconducting phases to 2223 phases, and facilitating grain growth;

(7) a step of highly densifying the 2223 phases by deformation processing or pressurization; and (8) a step of strongly bonding the 2223 phases with each other and finely dispersing the non-superconducting phases by a heat treatment.

In the step (2) which is carried out in advance of the step (3), the powder is preferably heat treated in the atmosphere, under decompression or in an inert gas, for the purpose of degassing.

In the step (5), the round wire is preferably worked into a tape type or flat type wire whose thickness is not more than 20% of the diameter of the round wire by single deformation processing.

The inventive method may further comprise a step of coating a plurality of the said round wires with a metal for obtaining a multifilamentary wire between the steps (4) and (5).

According to the present invention, it is possible to finely disperse non-superconducting phases in parts of 2223 phases in a superconductor portion of the as-obtained bismuth oxide superconducting wire. Thus, current paths are not hindered by the non-superconducting phases but connected with each other, whereby a bismuth oxide superconducting wire exhibiting a high critical current density is obtained. Since superconducting phases are formed with no hindrance by the non-superconducting phases, it is possible to obtain a bismuth oxide superconducting wire which has a substantially uniform critical current density over the longitudinal direction of the wire.

According to the present invention, therefore, obtained is a bismuth oxide superconducting wire having a high critical current density substantially uniformly over the longitudinal direction, whereby such a superconducting wire can be applied to a cable or a magnet with no problem.

According to the present invention, the aforementioned high critical current density is attained particularly since the powder is prepared to be not more than 1 μm in mean particle diameter in the step (1), the composite is subjected to deformation processing (or pressurization) a plurality of times through the steps (4), (5) and (7) after the step (3), and the same is heat treated a plurality of times through the steps (6) and (8).

When the powder is heat treated at a high temperature in the step (2) which is carried out in advance of the step (3) for degassing, bonding properties at the grain boundaries of the 2223 phases are improved and the superconducting wire is prevented from swelling, whereby the superconductor portion contained in the superconducting wire is prevented from cracking etc. Thus, it is possible to remove a factor for reducing the critical current density in the superconducting wire.

When the round wire is strongly worked into a tape type or flat type wire whose thickness is not more than 20% of the diameter of the round wire in the step (5) through single deformation processing, a cross-directional flow of the metal-coated powder is further prompted. Since such a cross-directional flow is caused with further constraint by upper and lower rolls or the like as compared with a longitudinal flow, the powder is further densified to provide a higher critical current density.

When the inventive method further comprises a step of coating a plurality of the said round wires with a metal for obtaining a multifilamentary wire between the steps (4) and (5), the superconductor is sectionally distributed in a plurality of portions in the as-obtained bismuth oxide superconducting wire. Thus, a prescribed critical current density can be provided by a plurality of superconductor portions, and the thickness of each superconductor portion can be reduced. Therefore, it is possible to improve distortion resistance of the critical current density of the bismuth oxide superconducting wire.

The foregoing and other objects, features, aspects and advantages of the present invention will become more apparent from the following detailed description of the present invention.

DESCRIPTION OF THE PREFERRED EMBODIMENTS

EXAMPLE 1

$Bi_2O_3$, PbO, $SrCO_3$, $CaCO_3$ and CuO were so blended that Bi, Pb, Sr, Ca and Cu were in composition ratios of 1.83:0.42:1.99:2.02:3.03, and this mixture was repeatedly subjected to heat treatments at 700° C. for 8 hours and 800° C. for 10 hours and a further heat treatment in a decompressed atmosphere of 8 Torr at 760° C. for 8 hours, and pulverized after the respective heat treatments. This powder was further heat treated at 860° C. for 5 hours. The as-obtained powder contained about 20% of 2223 phases in 2212 phases and non-superconducting phases. This powder was further pulverized in a wet ball mill, to obtain powder of 0.7 $\mu$m in mean particle diameter. The as-formed powder was degassed in a decompressed atmosphere of 8 Torr at 700° C. for 40 minutes.

Then the powder was filled up in a silver pipe of 12 mm in outer diameter and 8 mm in inner diameter, drawn into 1 mm in outer diameter, and then rolled into 0.18 mm in thickness through a single process, whereby a tape type wire was prepared.

Thereafter this wire was heat treated in the atmosphere at 845° C. for 150 hours. The wire was further rolled into 0.15 mm in thickness, and then heat treated in the atmosphere at 840° C. for 150 hours.

The as-formed wire exhibited a critical current density of 60,000 $A/cm^2$ at the liquid nitrogen temperature, to prove that a high critical current density can be attained according to the inventive method.

A superconductor portion of this wire was examined to ascertain that 2212 phases were phase-transformed by the first heat treatment to 2223 phases, which were grain-grown into 0.1 to 0.3 $\mu$m in thickness and several ten $\mu$m in width and length, and that these were highly densified by the rolling from 0.18 mm to 0.15 mm in thickness and strongly grain-bonded by the second heat treatment.

Further, the superconductor portion of the wire was provided with 8% in area ratio of non-superconducting phases mainly composed of $Ca_2PbO_4$, $Ca_2CuO_3$ and Ca—Sr—Cu—O (35 compound), which were finely dispersed in widths of not more than 2 $\mu$m.

EXAMPLE 2

$Bi_2O_3$, PbO, $SrCO_3$, $CaCO_3$ and CuO were blended so that Bi, Pb, Sr, Ca and Cu were in composition ratios of 1.76:0.47:1.96:2.14:2.98, and this mixture was repeatedly subjected to heat treatments at 710° C. for 10 hours and at 820° C. for 12 hours and a further heat treatment in a decompressed atmosphere of 3 Torr at 750° C. for 10 hours, and pulverized after the respective heat treatments. This powder was further heat treated at 860° C. for 8 hours. The as-obtained powder contained about 22% of 2223 phases in 2212 phases and non-superconducting phases. This powder was further pulverized in a dry ball mill, to obtain powder of 0.9 $\mu$m in mean particle diameter.

This powder was degassed in a nitrogen jet at 800° C. for 4 hours.

Then the powder was filled up in a silver pipe of 6 mm in outer diameter and 4 mm in inner diameter, drawn into 1 mm in outer diameter, and rolled into 0.17 mm in thickness through a single process.

Thereafter the wire was heat treated in a jet containing oxygen and nitrogen in a ratio of 1:4 at 845° C. for 100 hours, and rolled into 0.147 mm in thickness. Then the wire was heat treated in the atmosphere at 840° C. for 100 hours.

The as-obtained wire exhibited a critical current density of 63000 $A/cm^2$ at the liquid nitrogen temperature, to prove that a high critical current density can be attained according to the inventive method.

EXAMPLE 3

The powder prepared in Example 1 was filled up in a silver pipe of 12 mm in outer diameter and 10 mm in inner diameter, and drawn into 1.8 mm in outer diameter. 36 such wires were filled up in a silver pipe of 16.5 mm in outer diameter and 13.5 mm in inner diameter, which in turn was drawn into 1.8 mm in outer diameter and again drawn into 1.4 mm in outer diameter.

This wire was rolled into 0.24 mm in thickness through a single process, and heat treated in the atmosphere at 845° C. for 50 hours.

The as-formed tape type wire was further rolled into 0.2 mm in thickness, and heat treated at 840° C. for 50 hours.

The as-obtained wire exhibited a critical current density of 24000 A/cms at the liquid nitrogen temperature, to prove that a high critical current density can be attained according to the inventive method.

Although the present invention has been described in detail, it is clearly understood that the same is by way of illustration and example only and is not to be taken by way of limitation, the scope of the present invention being limited only by the terms of the appended claims.

What is claimed is:

1. A method of preparing a bismuth oxide superconducting wire, comprising the steps of:

preparing powder of not more than 1 $\mu$m in mean particle diameter containing a mixture of superconducting phases composed of 2212 phases and 2223 phases within said 2212 phases, and non-superconducting phases obtained by calcining and pulverizing raw material powder at least once;

degassing said powder by heat treating said powder at a high temperature in a decompressed atmosphere;

covering said powder with a metal thereby forming a composite;

preparing a round wire by deformation-processing the composite of said powder covered with said metal;

deformation-processing said round wire into a tape type or flat type wire;

heat treating said wire, thereby transforming said 2212 phases contained in said superconducting phases to 2223 phases, and thereby grain-growing said 2223 phases;

densifying said 2223 phases; and bonding said 2223 phases with each other and dispersing said non-superconducting phases by performing a heat treatment.

2. A method of preparing a bismuth oxide superconducting wire in accordance with claim 1, wherein said round wire is worked into a tape type wire whose thickness is not more than 20% of the diameter of said round wire by single deformation processing in said step of preparing a tape type wire.

3. A method of preparing a bismuth oxide superconducting wire in accordance with claim 1, further comprising a step of covering a plurality of said round wires with a metal for obtaining a multifilamentary wire between said step of preparing a round wire and said step of preparing a tape type wire.

4. A method of preparing a bismuth oxide superconducting wire in accordance with claim 1, wherein said degassing is accomplished by performing said heat treating of said powder in an inert gas.

5. A method of preparing a bismuth oxide superconducting wire in accordance with claim 1, wherein said step of densifying said 2223 phases comprises performing deformation pressurization.

6. A method of preparing a bismuth oxide superconducting wire in accordance with claim 1, wherein said step of densifying said 2223 phases comprises performing pressurization.

7. A method of preparing a bismuth oxide superconducting wire in accordance with claim 1, wherein said round wire is worked into a flat type wire whose thickness is not more than 20% of the diameter of said round wire by single deformation processing in said step of preparing a flat type wire.

8. A method of preparing a bismuth oxide superconducting wire in accordance with claim 1, further comprising a step of covering a plurality of said round wires with a metal for obtaining a multifilamentary wire between said step of preparing a round wire and said step of preparing a flat type wire.

9. A method of preparing a bismuth oxide superconducting wire, comprising the steps of:

preparing powder of not more than 1 $\mu$m in mean particle diameter containing a mixture of superconducting phases composed of 2212 phases and 2223 chases within said 2212 chases, and non-superconducting phases obtained by calcining and pulverizing raw material powder at least once;

degassing said powder by heat treating said powder at a high temperature in a decompressed atmosphere;

covering said powder with a metal thereby forming a composite;

preparing a round wire by deformation-processing the composite of said powder covered with said metal;

deformation-processing said round wire into a tape type wire, wherein said round wire is worked into a tape type wire whose thickness is not more than 20% of the diameter of said round wire by single deformation processing in said step of preparing a tape type wire;

heat treating said wire, thereby transforming said 2212 phases contained in said superconducting phases to 2223 phases, and thereby grain-growing said 2223 phases;

densifying said 2223 phases; and bonding said 2223 phases with each other and dispersing said non-superconducting phases by performing a heat treatment.

10. A method of preparing a multifilamentary bismuth oxide superconducting wire, comprising the steps of:

preparing powder of not more than 1 $\mu$m in mean particle diameter containing a mixture of superconducting phases composed of 2212 phases and 2223 phases within said 2212 phases, and non-superconducting phases obtained by calcining and pulverizing raw material powder at least once;

degassing said powder by heat treating said powder at a high temperature in a decompressed atmosphere;

covering said powder with a metal thereby forming a composite;

preparing a round wire by deformation-processing the composite of said powder covered with said metal;

covering a plurality of said round wires with a metal;

deformation-processing said plurality of said round wires for preparing a multifilamentary tape type or flat type wire;

heat treating said wire, thereby transforming said 2212 phases contained in said superconducting phases to 2223 phases, and thereby grain-growing said 2223 phases;

densifying said 2223 phases; and bonding said 2223 phases with each other and dispersing said non-superconducting phases by performing a heat treatment.

* * * * *